United States Patent
Bang et al.

(10) Patent No.: US 7,190,578 B2
(45) Date of Patent: Mar. 13, 2007

(54) PLASMA DISPLAY APPARATUS

(75) Inventors: Won-Kyu Bang, Suwon-si (KR); Ki-Jung Kim, Suwon-si (KR)

(73) Assignee: Samsung SDI Co., Ltd., Suwon (KR)

( * ) Notice: Subject to any disclaimer, the term of this patent is extended or adjusted under 35 U.S.C. 154(b) by 74 days.

(21) Appl. No.: 11/030,879

(22) Filed: Jan. 10, 2005

(65) Prior Publication Data
US 2005/0168943 A1 Aug. 4, 2005

(30) Foreign Application Priority Data
Jan. 29, 2004 (KR) .................. 10-2004-0005885

(51) Int. Cl.
*H05K 7/20* (2006.01)

(52) U.S. Cl. .............. 361/694; 361/695; 454/184; 415/222

(58) Field of Classification Search .......... 361/681, 361/687, 692–695, 717–727; 313/582, 584, 313/17, 46; 165/80.3, 80.4, 185, 121; 454/184; 415/119, 173.5, 173.6, 228, 211.1, 211.2; 416/185, 198 R, 226, 234
See application file for complete search history.

(56) References Cited
U.S. PATENT DOCUMENTS

| | | | | |
|---|---|---|---|---|
| 4,189,281 A | * | 2/1980 | Katagiri et al. | 415/222 |
| 4,692,091 A | * | 9/1987 | Ritenour | 415/119 |
| 4,895,489 A | * | 1/1990 | Kohama et al. | 415/218.1 |
| 5,000,079 A | * | 3/1991 | Mardis | 454/184 |
| 6,027,307 A | * | 2/2000 | Cho et al. | 415/173.6 |
| 6,198,222 B1 | * | 3/2001 | Chang | 313/582 |
| 6,254,343 B1 | * | 7/2001 | Schmidt et al. | 415/222 |
| 6,833,674 B2 | * | 12/2004 | Kaneko et al. | 313/587 |
| 6,853,553 B2 | * | 2/2005 | Seaton et al. | 361/695 |
| 6,948,912 B2 | * | 9/2005 | Chang et al. | 416/185 |

FOREIGN PATENT DOCUMENTS

| | | | |
|---|---|---|---|
| CN | 1286489 | | 3/2001 |
| CN | 2435780 | | 6/2001 |
| JP | 408303395 A | * | 11/1996 |
| JP | 410117079 A | * | 5/1998 |
| JP | 11284936 A | * | 10/1999 |
| JP | 2000-003137 | | 1/2000 |
| JP | 2003029648 A | * | 1/2003 |

* cited by examiner

*Primary Examiner*—Michael Datskovskiy
(74) *Attorney, Agent, or Firm*—H.C. Park & Associates, PLC

(57) ABSTRACT

A plasma display apparatus comprising a chassis base, a plasma display panel coupled to a first side of the chassis base, and a driving board, for driving the plasma display panel, attached on a second side of the chassis base opposite to the first side of the chassis base. A fan dissipates heat generated from the plasma display panel and components inside of the apparatus. The fan includes an intake diffuser for efficient airflow into the fan.

9 Claims, 5 Drawing Sheets

PLASMA DISPLAY APPARATUS

CROSS REFERENCE TO RELATED APPLICATION

This application claims priority to and the benefit of Korean Patent Application No. 10-2004-0005885, filed on Jan. 29, 2004, which is hereby incorporated by reference for all purposes as if fully set forth herein.

BACKGROUND OF THE INVENTION

1. Field of the Invention

The present invention relates to a plasma display apparatus, and in particular, to a plasma display apparatus that improves flow efficiency of a fan for dissipating heat generated inside the apparatus.

2. Discussion of the Background

Generally, a plasma display apparatus uses plasma generated by gas discharge to produce an image on a plasma display panel (PDP). The PDP may generate a lot of heat because the gas discharge occurs at a high temperature.

Furthermore, the PDP generates more heat when displaying brighter images. Therefore, efficient heat dissipation from the PDP is important for proper operation of the plasma display apparatus.

To assist with heat dissipation, the PDP may be attached to a chassis base made of a material with a high thermal conductivity. Additionally, a heat dissipation medium (or a thermally conductive medium) placed between the PDP and the chassis base transfers heat generated from the PDP to the chassis base, where it may be dissipated from the chassis base. The chassis base may be manufactured by a die-casting or pressing method using a metal such as aluminum, and the heat dissipation medium may be made from resins such as acrylic and silicone.

Also, a flexible printed circuit (FPC) may electrically connect the PDP electrodes (address electrodes and sustain electrodes) to a driving board having a driving circuit. The PDP driving board is typically installed on a surface of the chassis base.

As described above, the PDP and neighboring devices, such as the driving board, generate heat. Therefore, the chassis base may have attached fans that lower the temperature inside the apparatus by dissipating heat to the outside.

FIG. 5 shows a cross-sectional view of a fan installed in the chassis base of the plasma display apparatus via a plate spring or a rubber bushing according to the prior art.

FIG. 5A shows a mounting structure of the fan 59 to the chassis base 51 by means of bosses 53, a plate spring 55, and fan brackets 57. The fan brackets 57 are formed on one side of the plate spring 55, and the plate spring 55 is fixed at both ends to the bosses 53 by screws 61. The fan 59 is attached to the fan brackets 57. Driving the fan 59 dissipates heat generated inside the apparatus, and the plate spring 55 reduces noise transferred from the fan 59 through the fan bracket 57 by self-vibration.

FIG. 5B shows a mounting structure of the fan 59 to the chassis base 51 by means of bosses 53, a rubber bushing 63, and fan brackets 57. The fan bracket 57 is formed on one side of the rubber bushing 63, and the rubber bushing 63 is fixed to the boss 53 by a screw 61. The fan 59 is attached to the fan brackets 57. Driving the fan 59 dissipates heat generated inside the apparatus, and the rubber bushing 63 reduces noise transferred from the fan 59 through the fan bracket 57 by elastic deformation.

In such a plasma display apparatus, the fan 59 produces an airflow from inside of the apparatus to outside for dissipating the heat. While air in front of the inlet of the fan 59 may be formed into a smooth and well developed inflow, air out of the inlet of the fan 59 may form a swirl flow and take a right-angled turn towards the inlet of the fan 59. As the result, the flow rate decreases, and the difference in velocity between the airflow and the surrounding air may generate flow noise, which deteriorates the fan's heat dissipation efficiency.

SUMMARY OF THE INVENTION

The present invention provides a plasma display apparatus that may have enhanced heat dissipation by means of a fan structure.

Additional features of the invention will be set forth in the description which follows, and in part will be apparent from the description, or may be learned by practice of the invention.

The present invention discloses a plasma display apparatus including a chassis base; a PDP positioned adjacent and parallel to a first side of the chassis; a driving board, in electrical connection with the PDP for driving the PDP, attached on a second side opposite to the first side of the chassis base where the PDP is positioned; and a fan dissipating the heat generated from the PDP and other components inside the apparatus. The fan includes an intake diffuser for efficient airflow into the fan.

It is to be understood that both the foregoing general description and the following detailed description are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this specification, illustrate embodiments of the invention and together with the description serve to explain the principles of the invention.

DETAILED DESCRIPTION OF THE ILLUSTRATED EMBODIMENTS

Figure 1:
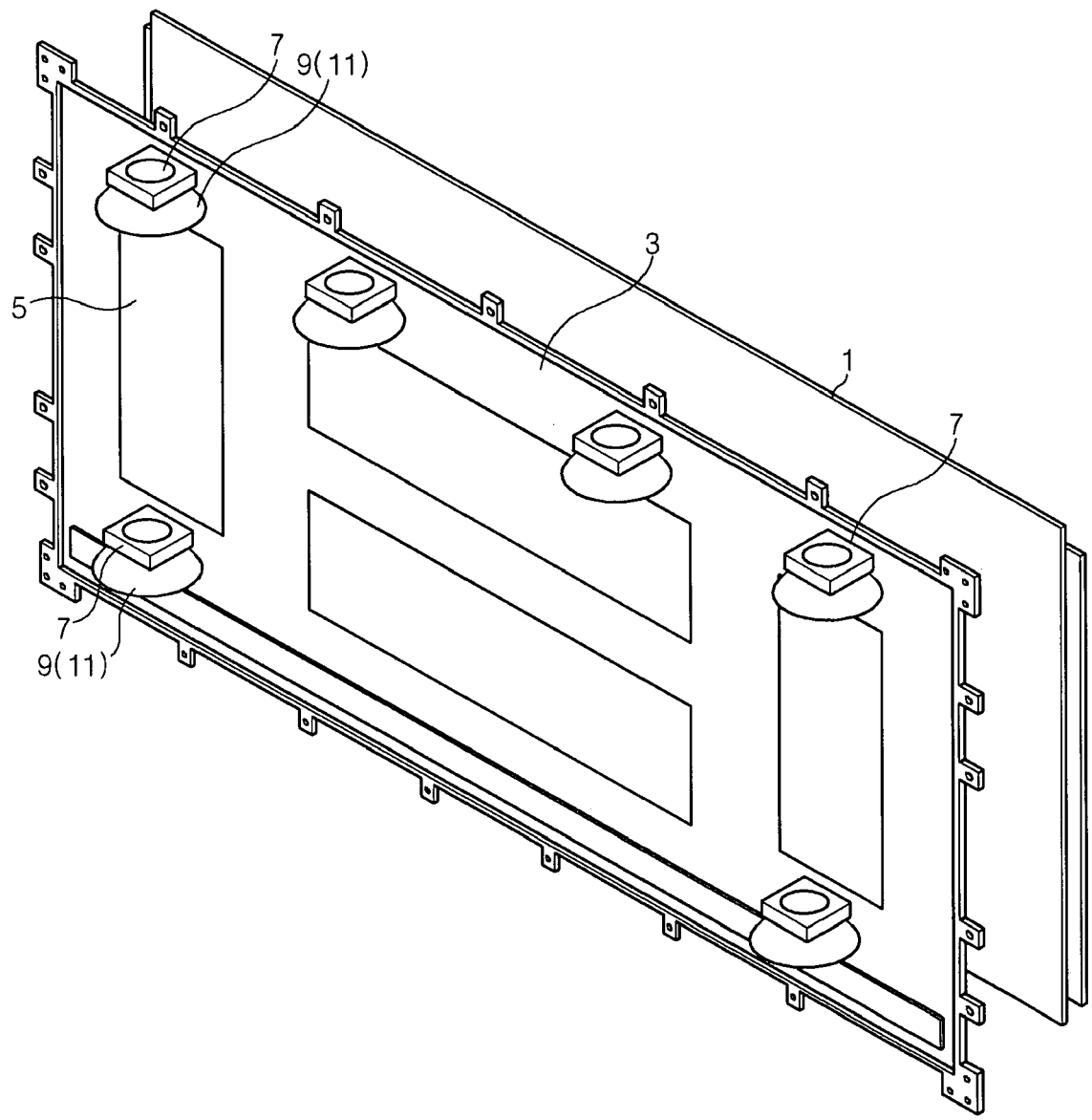
FIG. 1 is a schematic view showing a plasma display apparatus according to an exemplary embodiment of the present invention.
Figure 2:
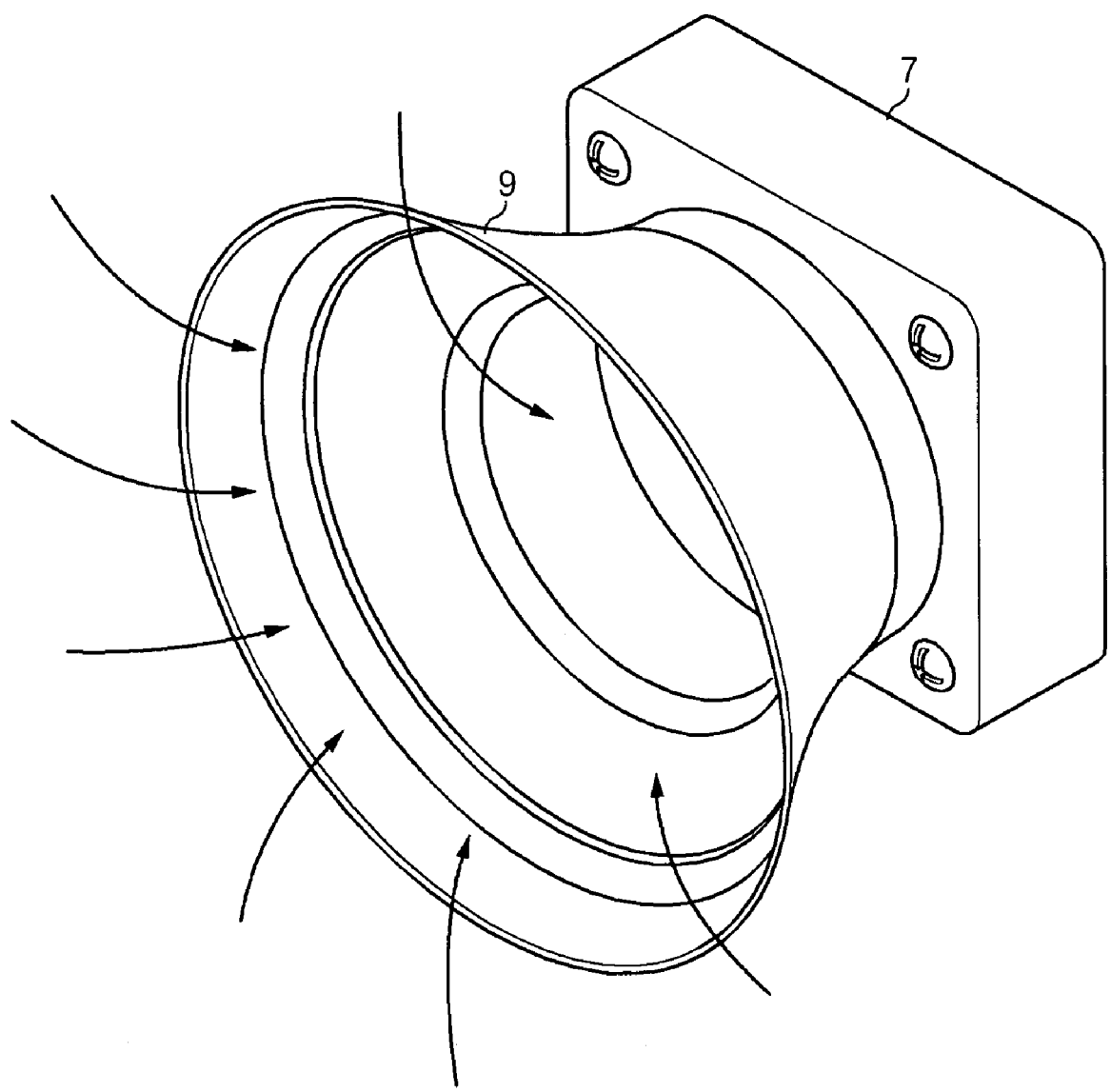
FIG. 2 is a perspective view showing an intake diffuser installed on a fan of the plasma display apparatus according to an exemplary embodiment of the present invention.

The present invention will be described more fully with reference to the accompanying drawings showing exemplary embodiments of the invention. The drawings and embodiments described in detail are exemplary and are provided for purposes of illustration. Accordingly, the invention is not limited to the exemplary embodiments shown in the drawings.

Referring to FIG. 1, FIG. 2, FIG. 3 and FIG. 4, a plasma display apparatus in accordance with an exemplary embodiment of the present invention includes a chassis base 3 and a PDP 1, which may include two glass plates.

The PDP 1 may be attached to one side of the chassis base 3 by an adhesive means such as double-sided tape, and a driving board 5 for driving the PDP 1 is attached to the other side of the chassis base 3. The chassis base 3 and the PDP 1 are substantially parallel to each other, and a heat dissipation medium (or thermally conductive medium, not shown) may be positioned therebetween.

A front cover (not shown) is placed over the PDP 1, and a back cover (not shown) is placed over the chassis base 3 to complete assembly of a plasma display set.

Conventionally, the PDP 1 has a rectangular shape, and the chassis base 3 is made of aluminum, which has a high thermal conductivity.

The PDP 1 may be coupled to the driving board 5 via a FPC (not shown), and the driving board 5 provides an electrical signal for driving the PDP 1.

A fan 7 may be installed to dissipate heat from the PDP 1, the driving board 5, and the inside of the apparatus for the apparatus proper operation. A plurality of fans 7 may be installed in the plasma display apparatus, and FIG. 1 shows the fans 7 attached to the chassis base.

Since the driving board 5 generates a lot of heat, the fans 7 are preferably installed on the same side of the chassis base 3 as the driving board 5. Also, the fan 7 may be positioned parallel to the side of the chassis base 3 in order to form the airflow along the chassis base 3. Positioning two fans 7 near upper and lower ends of the driving board 5, respectively, may help efficiently dissipate heat from the driving board 5. In this case, the two fans 7 may be aligned with each other such that air coming into one fan 7 is discharged toward the second, and the second fan 7 discharges air in substantially the same direction as the first fan 7.

The fans 7 draw air from one end of the chassis base 3 and discharge the air to the opposite end of the chassis base 3. Therefore, the airflow is formed inside the apparatus and along one side of the chassis base 3 to carry heat to the outside.

Additionally, an intake diffuser 9 may be installed at one end of the fan 7 for efficient airflow. The intake diffuser 9 is positioned at the inlet of the fan 7 such that air in front of and surrounding the fan 7 may be pulled into it while forming a smooth airflow along the intake diffuser 9.

Figure 3:
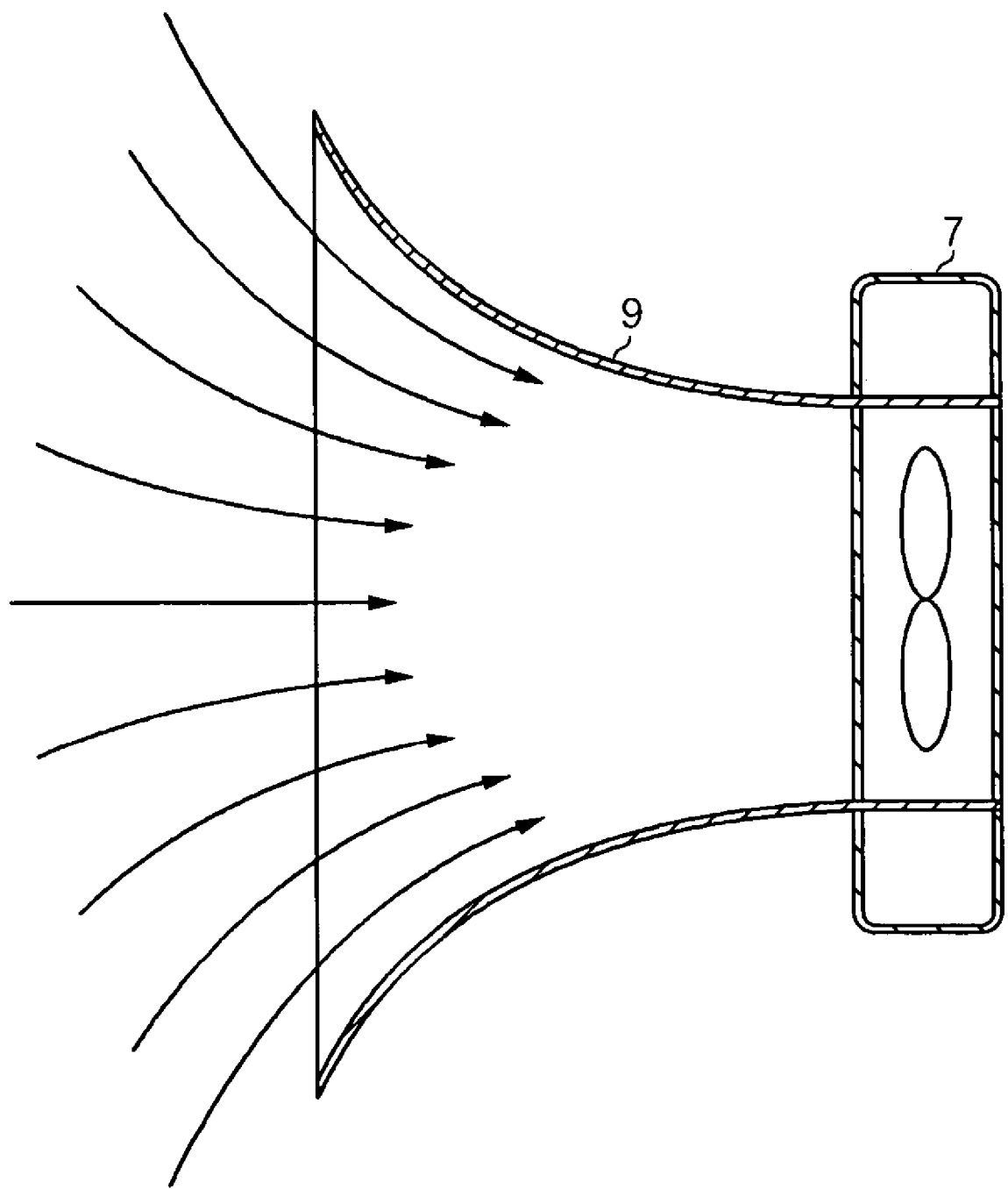
FIG. 3 is a cross-sectional view of FIG. 2.

The intake diffuser 9 may be shaped as a venturi tube, where the end nearest the inlet of the fan 7 may have a narrow flow passage, while the end farthest from the fan 7 may have a wide flow passage. Consequently, as shown in FIG. 3, when the fan operates, air in front of it and in the wide region surrounding it may be smoothly drawn into the intake diffuser.

Additionally, both ends of the intake diffuser 9 may be connected with an inwardly convex surface to the centerline of the flow passage, which may result in smooth airflow inside the intake diffuser 9.

Forming both the ends of the intake diffuser 9 with a circular shaped cross section and connecting them with an inwardly convex surface may be advantageous to smooth airflow.

Moreover, in terms of fluid dynamics, smooth airflow may reduce flow noise, thereby increasing flow rate and heat dissipation efficiency.

Figure 4:
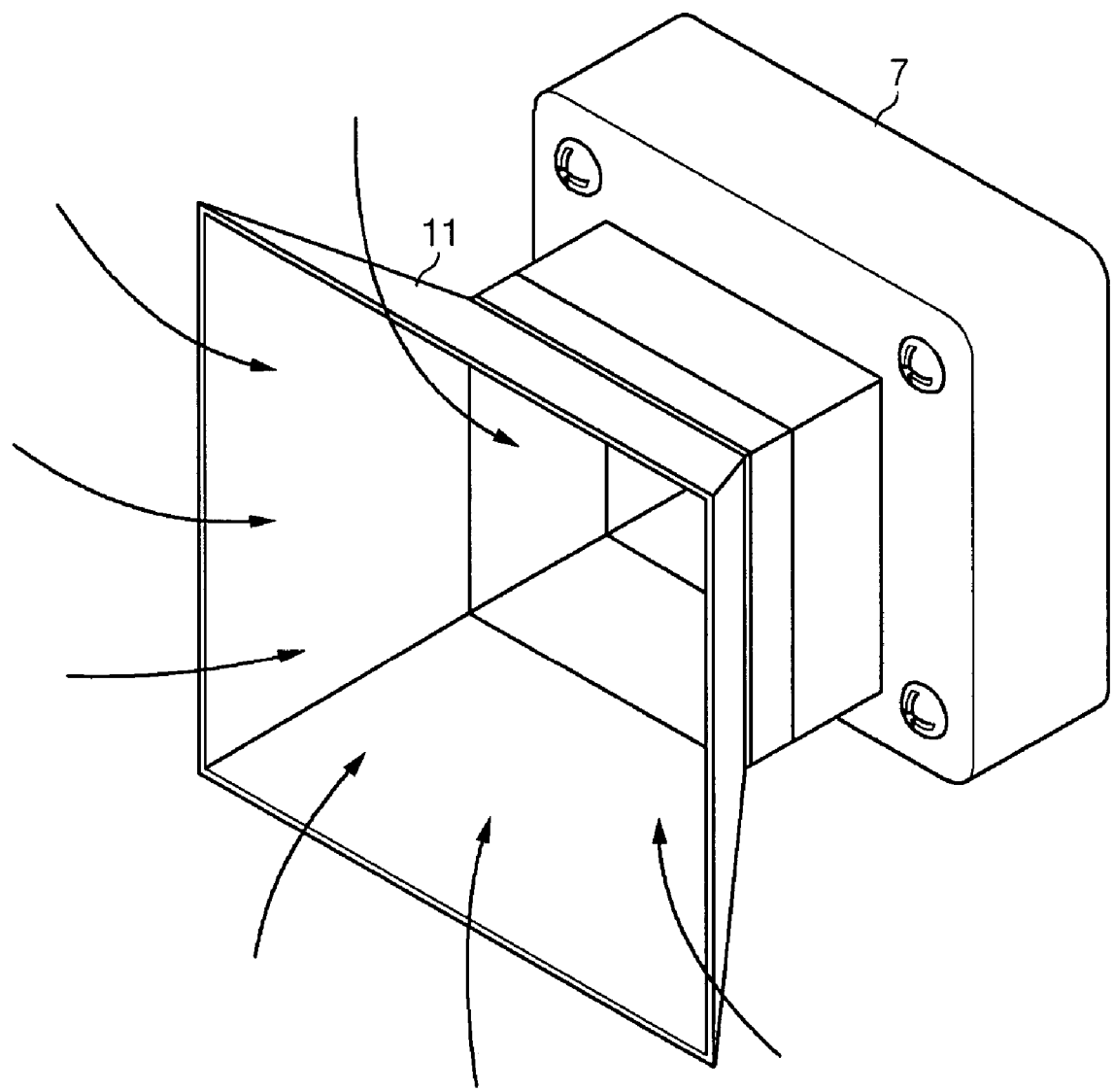
FIG. 4 is a perspective view showing an intake diffuser installed on a fan of a plasma display apparatus according to an exemplary embodiment of the present invention.
Figure 5A:
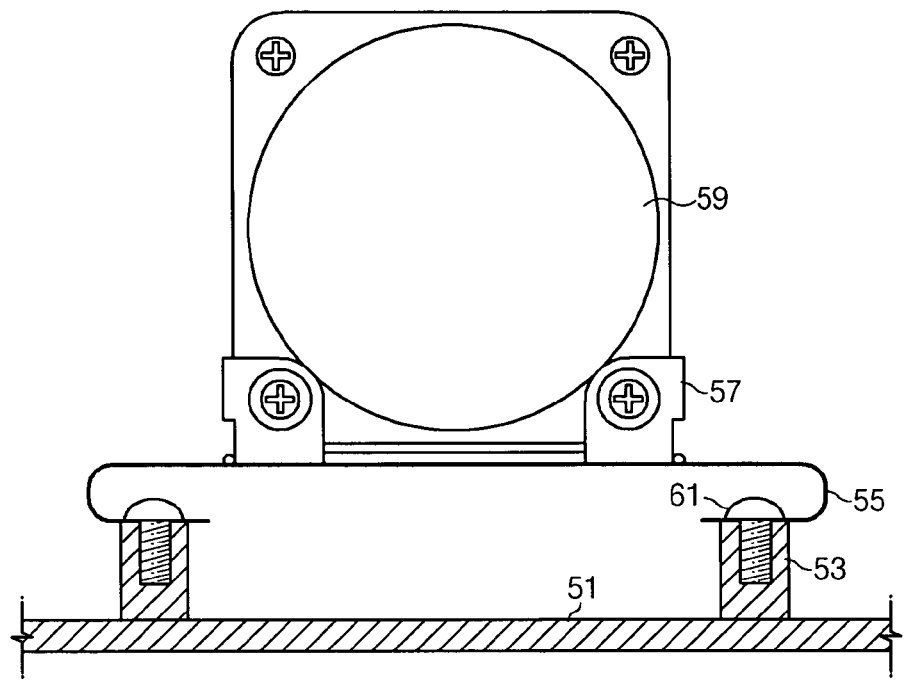
FIG. 5A and FIG. 5B are cross-sectional views showing a conventional fan mounting by means of a plate spring or a rubber bushing.
Figure 5B:
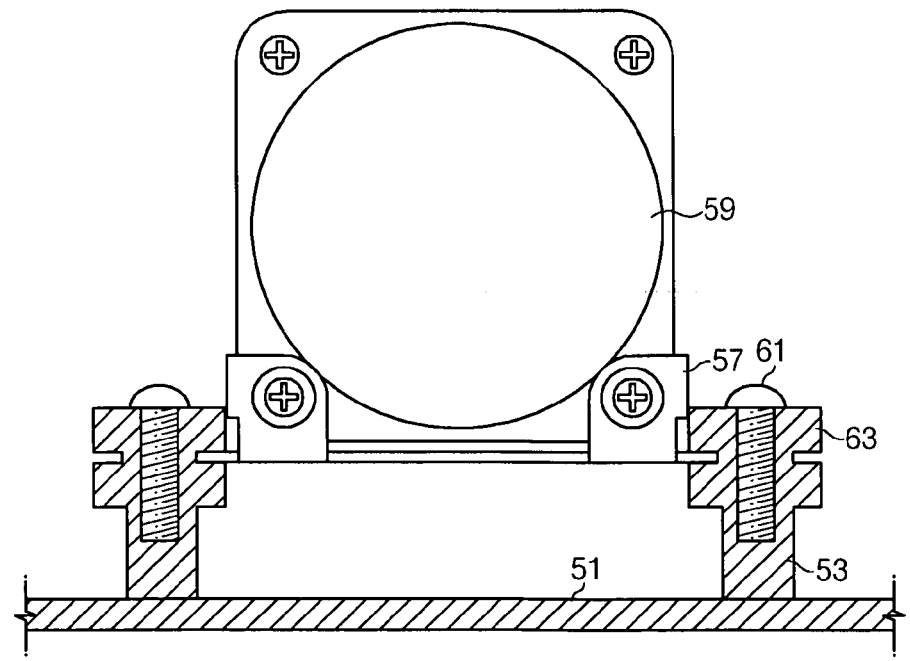

FIG. 4 is a perspective view showing an intake diffuser attached to a fan in another exemplary embodiment of the present invention.

Unlike the intake diffuser 9, the intake diffuser 11 has a polygonal (rectangular) flow passage. In the intake diffuser 11, the end nearest the inlet of the fan 7 may have a narrow polygonal flow passage, and the end farthest from the fan 7 may have a wide polygonal flow passage. The two ends of the intake diffuser 11 may be connected with inwardly convex surfaces. Like the intake diffuser 9, the intake diffuser 11 induces air in front of and surrounding the fan 7 to smoothly flow toward the fan 7.

As shown in FIG. 1, a plurality of fans 7 may be installed in the plasma display apparatus. If each fan 7 has an intake diffuser 9 or 11, aligning the intake diffusers in a direction forming a continuous airflow may provide for more efficient heat dissipation. In other words, the intake diffusers 9 or 11 may be aligned in a direction such that air discharged from one fan is pulled into another.

It will be apparent to those skilled in the art that various modifications and variation can be made in the present invention without departing from the spirit or scope of the invention. Thus, it is intended that the present invention cover the modifications and variations of this invention provided they come within the scope of the appended claims and their equivalents.

What is claimed is:

1. A plasma display apparatus, comprising:
   a chassis base;
   a plasma display panel coupled to a first side of the chassis base;
   a driving board, attached to a second side of the chassis base that is opposite to the first side of the chassis base, for driving the plasma display panel; and
   a fan for dissipating heat,
   wherein the fan includes an intake diffuser.

2. The plasma display apparatus of claim 1, wherein the intake diffuser is shaped as a venturi tube having a narrower flow passage near the fan than away from the fan.

3. The plasma display apparatus of claim 1,
   wherein the intake diffuser has a circular shaped passage;
   wherein the circular shaped passage is narrower near the fan than away from the fan; and
   wherein an inwardly convex surface connects both ends of the intake diffuser.

4. The plasma display apparatus of claim 1,
   wherein the intake diffuser has a polygonal shaped passage;
   wherein the polygonal shaped passage is narrower near the fan than away from the fan; and
   wherein an inwardly convex surface connects both ends of the intake diffuser.

5. The plasma display apparatus of claim 1, wherein a plurality of fans are aligned in a direction such that air discharged from a fan at a first end of the chassis base is pulled into a fan at a second end of the chassis base.

6. The plasma display apparatus of claim 1, wherein the fan is installed on the second side of the chassis base.

7. The plasma display apparatus of claim 6, wherein the fan generates an airflow direction that is parallel to the second side of the chassis base.

8. The plasma display apparatus of claim 1, wherein a first fan is installed near a first end of the driving board and a second fan is installed near a second end of the driving board.

9. The plasma display apparatus of claim 8, wherein air is discharged from the first fan and the second fan in substantially a same direction.

* * * * *